(12) United States Patent
Wu et al.

(10) Patent No.: US 7,135,408 B2
(45) Date of Patent: Nov. 14, 2006

(54) METAL BARRIER INTEGRITY VIA USE OF A NOVEL TWO STEP PVD-ALD DEPOSITION PROCEDURE

(75) Inventors: Zhen-Cheng Wu, Hsinchu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/283,862

(22) Filed: Oct. 30, 2002

(65) Prior Publication Data

US 2004/0087136 A1   May 6, 2004

(51) Int. Cl.
H01L 21/44 (2006.01)
(52) U.S. Cl. .............. 438/680; 438/618; 257/E21.575
(58) Field of Classification Search .............. 438/622, 438/627, 637, 648, 685, 680, 618
See application file for complete search history.

(56) References Cited

U.S. PATENT DOCUMENTS

| | | | |
|---|---|---|---|
| 5,654,233 A * | 8/1997 | Yu | 438/643 |
| 6,287,965 B1 | 9/2001 | Kang et al. | 438/648 |
| 6,319,850 B1 * | 11/2001 | Chang et al. | 438/763 |
| 6,333,260 B1 | 12/2001 | Kwon et al. | 438/643 |
| 6,342,448 B1 * | 1/2002 | Lin et al. | 438/687 |
| 6,368,954 B1 | 4/2002 | Lopatin et al. | 438/627 |
| 6,482,733 B1 * | 11/2002 | Raaijmakers et al. | 438/633 |
| 6,506,692 B1 * | 1/2003 | Andideh | 438/796 |
| 6,528,409 B1 * | 3/2003 | Lopatin et al. | 438/618 |
| 6,555,476 B1 * | 4/2003 | Olsen et al. | 438/692 |
| 6,731,007 B1 * | 5/2004 | Saito et al. | 257/762 |

OTHER PUBLICATIONS

Alers, "Barrier-First Integration for Improved Reliability in Copper Dual Damascene Interconnects", IEEE, 2003, pp. 27-29.
Tōkei, "Reliability of Copper Dual Damascene Influenced by Pre-Clean", IEEE Proceedings of 9th IPFA 2002, Singapore, pp.118-123.
Su, "Low k Damage Control & Its Reliability for Organic Hybrid Dual Damascene", IEEE Proceedings of 11th IPFA 2004, Taiwan, pp. 69-70.
Wu, "Advanced Metal Barrier Free Cu Damascene interconnects with PECVD Silicon Carbide Barriers for 90/65-nm BEOL Technology", IEEE-IEDM, 2002, pp. 595-598.

* cited by examiner

*Primary Examiner*—Alexander Ghyka
(74) *Attorney, Agent, or Firm*—Haynes and Boone, LLP

(57) ABSTRACT

A method of forming a barrier layer on the surface of an opening defined in a porous, low dielectric constant (low k), layer, has been developed. The method features the use of a two step deposition procedure using a physical vapor deposition (PVD), procedure to initially deposit a thin underlying, first component of the barrier layer, while an atomic layer deposition (ALD), procedure is then employed for deposition of an overlying second barrier layer component. The underlying, thin barrier layer component obtained via PVD procedures is comprised with the desired properties needed to interface the porous, low k layer, while the overlying barrier layer component obtained via ALD procedures exhibits excellent thickness uniformity.

26 Claims, 2 Drawing Sheets

METAL BARRIER INTEGRITY VIA USE OF A NOVEL TWO STEP PVD-ALD DEPOSITION PROCEDURE

BACKGROUND OF THE INVENTION (1) Field of the Invention

The present invention relates to methods used to fabricate semiconductor devices, and more specifically to a method used to form a barrier layer on the surface of an opening in a low dielectric constant material, wherein the opening is to be used to accommodate a damascene type metal structure.

(2) Description of Prior Art

The use of copper interconnect structures, and of low constant dielectric (low k), layers, has allowed increased performance of semiconductor devices to be realized. Resistance decreases resulting from copper interconnect and via structures exhibiting lower sheet resistance than counterpart structures formed from aluminum based materials, in addition to the capacitance reductions obtained via the use of intermetal dielectric (IMD), layers comprised of low k layers such as fluorinated silicon glass (FSG), as well as other silicon low k (SiLK), materials, has allowed the reduction in resistance-capacitance (RC), to be achieved. However when forming a copper structure in an opening defined in a low k layer, barrier layers have to be used between the copper structure and the low k layer surface to avoid copper penetration into the low k, IMD material. Barrier layers such as titanium nitride have been used for this purpose. To perform the function of a thin barrier layer the material chosen should present excellent barrier properties in addition to being able to be formed using a deposition mode which will result in excellent barrier layer thickness uniformity on all surface of the opening in the low k layer.

Prior art, such as Lopatin et al, in U.S. Pat. No. 6,368,954 B1, Kwon et al, in U.S. Pat. No. 6,333,260 B1, and Kang et al, in U.S. Pat. No. 6,287,965 B1, describe barrier layers obtained via atomic layer deposition (ALD), procedures which satisfy the uniform deposition requirement. However the use of ALD procedures include precursor sequences using such materials as $TiCl_4$ and $NH_3$ which can penetrate porous regions of the exposed low k material resulting in undesired pinhole formation in the low k IMD layer. This invention will describe a novel barrier layer obtained via a two step deposition procedure which allows a thin uniform barrier layer to be deposited on the exposed surfaces of the opening in the low k layer, however without damage to the porous low k material.

SUMMARY OF THE INVENTION

It is an object of this invention to form a barrier layer on the exposed surfaces of an opening defined in a low k layer, wherein the opening is used to accommodate a metal structure.

It is another object of this invention to use a two step procedure for deposition of the barrier layer.

It is still another object of this invention to employ a first type deposition mode to from a thin underlying, non penetrating component of the barrier layer on the porous surfaces of the low k layer, followed by a second type deposition mode employed to form a thicker, uniform component of the barrier layer on the underlying thin barrier layer component.

In accordance with the present invention a two step deposition procedure used to form a uniform barrier layer on the surfaces of an opening defined in a low k layer, wherein the opening is used to accommodate a metal structure, is described. An opening in a low k layer is defined exposing a portion of the top surface of an underlying conductive interconnect structure. The first step of the two step barrier deposition procedure is performed using a physical vapor deposition (PVD), procedure, resulting in the formation of a thin barrier layer component on the exposed, porous surfaces of the low k layer, as well as on the surface of the underlying conductive interconnect structure, exposed at the bottom of the opening. An ALD procedure is next employed as the second step of the two step barrier deposition procedure, resulting in a thicker, uniform, overlying barrier layer component located on the surface of the underlying, thin barrier layer component. After deposition of a metal layer, completely filling the opening in the low k layer, unwanted portions of the metal layer are removed resulting in a damascene type, metal structure situated in the opening in the low k layer, with a barrier layer obtained via a two step deposition procedure, located on the surfaces of the low k layer and underlying the metal structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
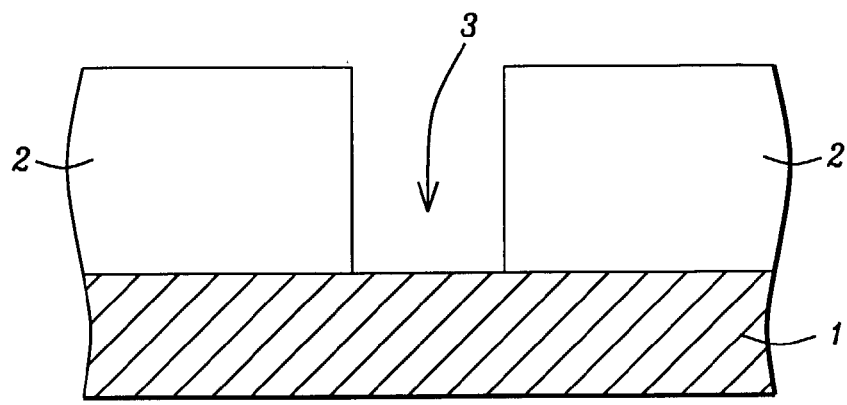
FIGS. 1–5, which schematically in cross-sectional style describe key stages of the procedures used to form a uniform barrier layer on the surfaces of an opening defined in a low k material, wherein the opening is to be used to accommodate a damascene type metal structure.

The method of forming a uniform barrier layer via a two step deposition procedure, on the surfaces of an opening defined in a low k material wherein the opening is used to accommodate a damascene type metal structure, will now be described in detail. Conductive layer 1, shown schematically in FIG. 1, can be a lower level metal interconnect structure or a metal via structure, which in turn communicates with active device regions in a semiconductor substrate. Conductive layer 1, can be comprised of copper, tungsten, or an aluminum based material such as aluminum-copper. Intermetal dielectric (IMD), layer 2, comprised of a low dielectric constant (low k), material such as a fluorinated silicon glass (FSG), or a silicon low k (SiLK) material, is next deposited to a thickness between about 3000 to 7000 Angstroms, via chemical vapor deposition (CVD), procedures. To satisfy performance objectives an IMD layer with a dielectric constant between about 2.5 to 3.0 is chosen. A photoresist shape, not shown in the drawings, is next used as an etch mask to allow an anisotropic reactive ion etch (RIE), procedure to selectively define opening 3, in low k, IMD layer 2. The selective RIE procedure is performed using $CHF_3$ as an etchant for IMD layer 2, selectively terminating at the appearance of the top surface of conductive layer 1. The smallest dimension of opening 3, needed for the definition of sub-100 nm, back end of the line (BEOL), structures, is between about 0.12 to 0.14 um. After definition of opening 3, the photoresist shape is removed via plasma oxygen ashing procedures. The result of the above procedures is schematically shown in FIG. 1.

Opening 3, will subsequently be filled with copper, however to avoid copper penetration into porous, IMD layer 2, a barrier layer is needed to separate the subsequent copper structure from the porous low k, IMD layer 2. Since opening 3, was defined with sub-micron features the barrier layer has to be thin to allow adequate space in opening 3, for the subsequent copper structure. Atomic layer deposition (ALD), features excellent uniformity, even when depositing thin layers, less than 50 Angstroms, and would be an excellent candidate to form a uniform, thin barrier layer on the exposed surfaces of opening 3. However the ALD procedure is comprised with multiple process cycles, with each cycle featuring injection of the reactants needed for a barrier layer such as titanium nitride, with $TiCl_4$ and $NH_3$ reactants. These precursor components, $TiCl_4$ and $NH_3$ can find porous regions in low k, IMD layer 2, sometimes resulting in discontinuous barrier layers, or layers now featuring unwanted pin holes. Therefore although the uniformity of thin ALD layers is excellent, the combination of the reactants employed during the deposition procedure, and the porosity of the exposed low k, IMD layer, can result in non-optimum barrier layers. Therefore a two step deposition procedure is employed to take advantage of the excellent uniformity of the ALD procedure, with the ALD procedure employed after deposition of a thin, physical vapor deposited (PVD), layer which is deposited on the porous low k, IMD layer, without the use of the precursor components of the ALD procedure.

Figure 2:
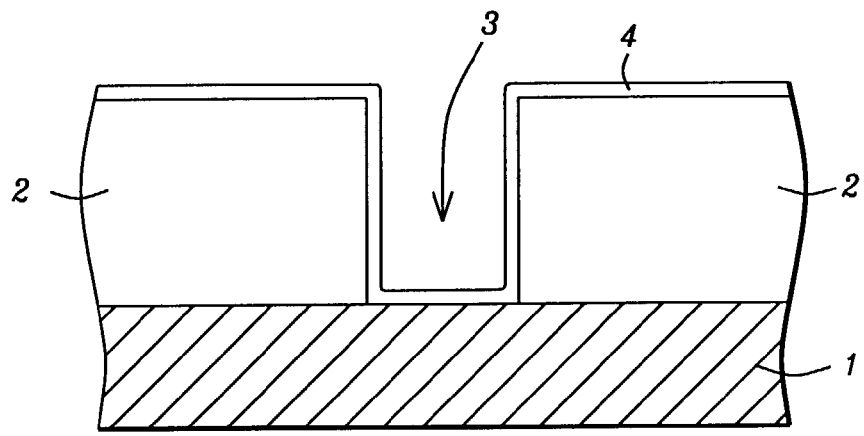

Underlying barrier layer 4, a layer such as titanium nitride, is deposited via PVD procedures, to a thickness between about 20 to 50 Angstroms. Barrier layer 4, seals the surface of porous low k, IMD layer 2, enabling a subsequently ALD deposition to be employed without damage to the low k, IMD layer. The confomality of barrier layer 4, shown schematically in FIG. 2, in small dimension features is not as good as the confomality or uniformity of counterpart layers obtained via ALD procedures, and therefore is maintained thin for purposes of sealing the surface of low k, IMD 2. If desired underlying barrier layer 4, can also be comprised of materials such as tantalum, tantalum nitride, titanium, tungsten, or tungsten nitride.

Figure 3:
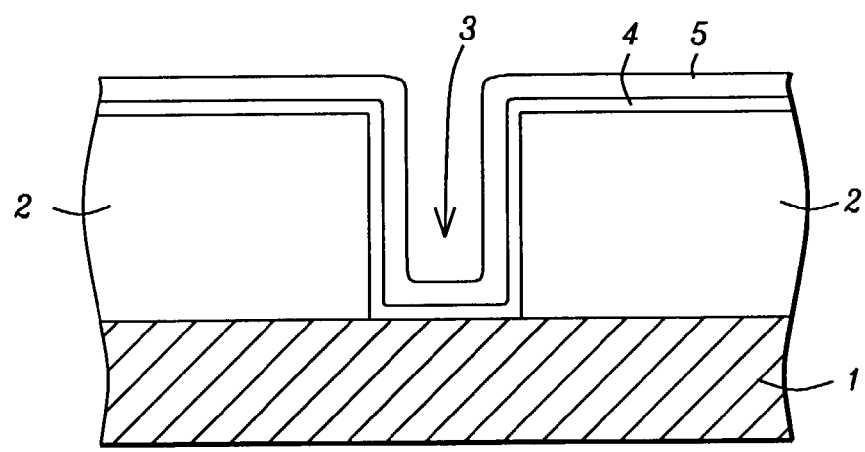

After formation of underlying barrier layer 4, an ALD procedure is employed to deposit overlying barrier layer 5. If overlying barrier layer 5, is comprised of titanium nitride the precursor or reactants used will be $TiCl_4$ and $NH_3$. Overlying barrier layer 5, shown schematically in FIG. 3, comprised of titanium nitride, is uniformly formed to a thickness between about 100 to 300 Angstroms. The presence of underlying barrier layer 4, protected low k, IMD layer 2, from the reactants used during the ALD procedure. Thus a two step deposition procedure featuring thin, sealing underlying barrier layer 4, obtained via PVD procedures, and a uniform, overlying barrier layer 5, obtained via ALD procedures, is used to satisfy the barrier requirements for copper structures located in openings defined in low k IMD layers. If desired overlying barrier layer 5, can also be comprised of tantalum, tantalum nitride, titanium, tungsten, or tungsten nitride, each obtained via ALD procedures.

Figure 4:
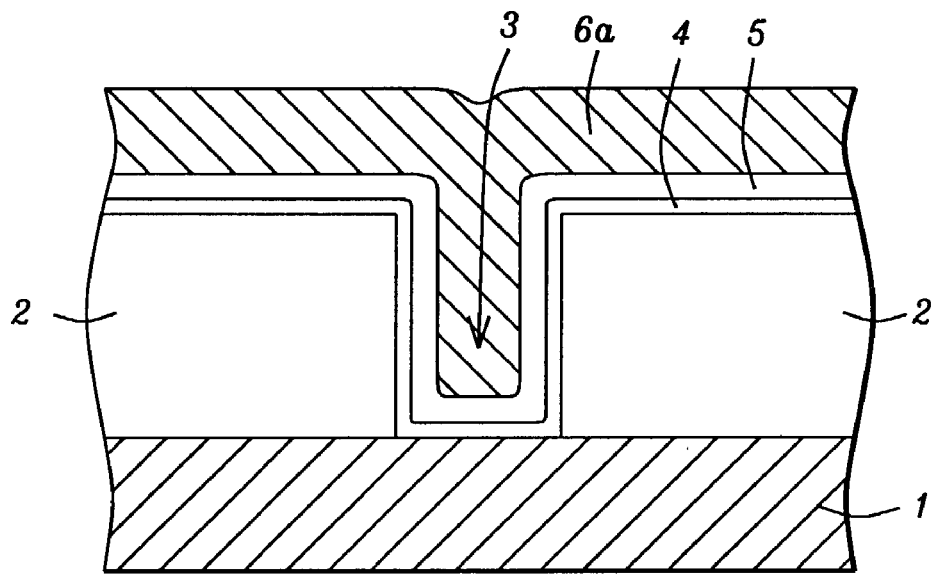
Figure 5:
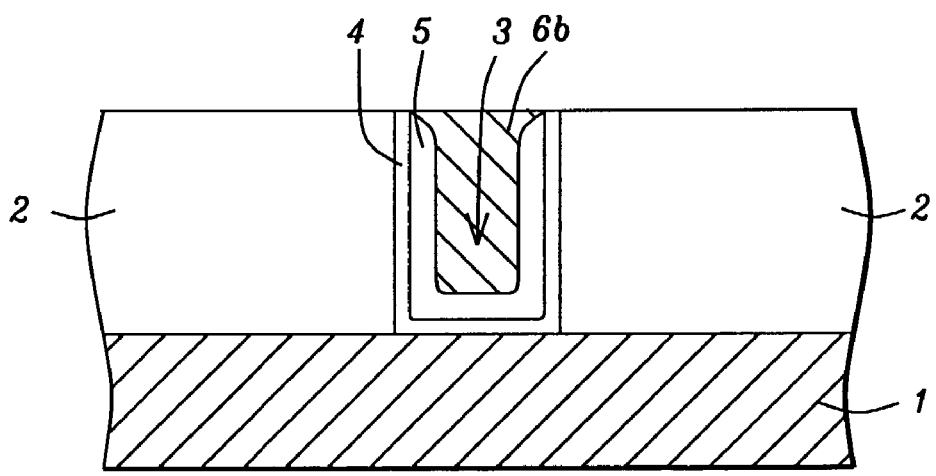

The formation of a metal structure such as copper, in opening 3, is next addressed and schematically described using FIGS. 4–5. A thin seed layer of copper, not shown in the drawings, can be first deposited via CVD procedures, overlying barrier layer 5. Copper layer 6a, is next deposited either via CVD, or via electroplating procedures, to a thickness between about 2000 to 5000 Angstroms, completely filling opening 3. This is schematically shown in FIG. 4. Removal of the portions of copper layer 6a, from the top surface of low k, IMD layer 2, is next accomplished via chemical mechanical polishing (CMP), procedures, resulting in the damascene type, copper structure 6b, in opening 3. This is schematically shown in FIG. 5. The CMP procedure also results in the removal of the barrier layers located on the top surface of low k, IMD layer 3, with the selective CMP procedure terminating at the appearance of the top surface of low k, IMD layer 2. If desired removal of unwanted portions of copper layer 6a, can be accomplished via a selective RIE procedure using $Cl_2$ as an etchant for copper. Although a damascene copper structure has been used as an example, the two step deposition procedure can be used to deposit barrier layers for applications featuring dual damascene type metal structures.

While this invention has been particularly shown and described with reference to, the preferred embodiments thereof, it will be understood by those skilled in the art that various changes in form and details may be made without departing from the spirit and scope of this invention.

What is claimed is:

1. A method of forming a conductive layer on an underlying low dielectric constant (low k) layer, comprising the steps of:

providing said low k layer, said low k layer having a top surface thereon;

forming an opening in said low k layer, said opening having sidewalls and a bottom;

performing a first deposition procedure of a two step deposition procedure using only a plasma vapor deposition (PVD), to form a first portion of said conductive layer directly on said top surface of said low k layer and directly on said sidewalls and said bottom of said opening;

performing a second deposition procedure of said two step deposition procedure using chemical vapor deposition (CVD), to form a second portion of said conductive layer, resulting in said conductive layer on said low k layer comprised of said second portion of said conductive layer overlying said first portion of said conductive layer; and forming in said opening in said low k layer a conductive structure made from a material different from said second portion of said conductive layer, said conductive structure directly contacting said second portion of said conductive layer and being free of contact with said first portion of said conductive layer.

2. The method of claim 1, wherein said low k layer is a porous low k layer selected from the group consisting of fluorinated silicon glass (FSG) layer, and a silicon low k (SiLK) layer.

3. The method of claim 1, wherein said low k layer is comprised with a dielectric constant between about 2.5 to 3.

4. The method of claim 1, wherein said conductive layer is a barrier layer comprised of a material chosen from a group that contains titanium nitride, titanium, tantalum nitride, tantalum, tungsten nitride, or tungsten.

5. The method of claim 1, wherein the thickness of said first portion of said conductive layer is between about 20 to 50 Angstroms.

6. The method of claim 1, wherein said second deposition procedure of said two step deposition procedure, said chemical vapor deposition, is an atomic layer deposition procedure.

7. The method of claim 1, wherein the thickness of said second portion of said conductive layer is between about 100 to 300 Angstroms.

8. A method of forming a barrier layer on the surface of an opening defined in a low dielectric constant (low k) layer, using a two step deposition procedure, comprising the steps of:

providing a lower level metal structure;

depositing said low k layer on said lower level metal structure, said low k layer having a top surface;

defining said opening in said low k layer, exposing a portion of a top surface of said lower level metal structure, said opening having sidewalls on said low k layer, and having a bottom defined by the exposed portion of said top surface of said lower level metal structure;

performing a first deposition procedure of said two step deposition procedure, a physical vapor deposition only procedure, to form a first portion of said barrier layer, at a thickness between 20 to 50 Angstroms, directly on the top surface of said low k layer and directly on the sidewalls and bottom of said opening;

performing a second deposition procedure of said two step deposition procedure, a atomic layer deposition procedure, to form a second portion of said barrier layer, resulting in said barrier layer on the top surface of said low k layer and on the sidewalls and bottom of said opening, with said barrier layer comprised of said first portion of said barrier layer and of said second portion of said barrier layer overlying said first portion thereof; and forming in said opening in said low k layer an upper level metal structure made from a material different from said second portion of said barrier layer, said upper level metal structure directly contacting said second portion of said barrier layer, and being free of contact with said first portion of said barrier layer.

9. The method of claim 8, wherein said low k layer is a porous low k layer made from one of a fluorinated silicon glass (FSG) layer and a silicon low k (SiLK) layer.

10. The method of claim 8, wherein said low k layer is comprised with a dielectric constant between about 2.5 to 3.

11. The method of claim 8, wherein the thickness of said low k layer is between about 3000 to 7000 Angstroms.

12. The method of claim 8, wherein said opening in said low k layer is defined via an anisotropic reactive ion etch procedure using $CHF_3$ as an etchant for said low k layer.

13. The method of claim 8, wherein the smallest dimension, regarding a diameter or width of said opening, is between about 0.12 to 0.14 um.

14. The method of claim 8, wherein said barrier layer is comprised of a material chosen from a groups that contains titanium nitride, titanium, tantalum nitride, tantalum, tungsten nitride, or tungsten.

15. The method of claim 8, wherein the thickness of said second portion of said barrier layer is between about 100 to 300 Angstroms.

16. A method of forming a titanium nitride barrier layer on the surface of an opening defined in a low dielectric constant (low k) layer using a two step deposition procedure, comprising the steps of:

providing a lower level metal structure;

depositing said low k layer on said lower level metal structure, said low k layer having a top surface;

defining said opening in said low k layer, exposing a portion of a top surface of said lower level metal structure, said opening having sidewalls on said low k layer, and having a bottom defined by the exposed portion of said top surface of said lower level metal structure;

performing a physical vapor deposition (PVD) only procedure to deposit a first portion of said titanium nitride barrier layer, at a thickness between about 20 to 50 Angstroms, directly on the top surface of said low k layer and directly on the sidewalls and bottom of said opening;

performing an atomic layer deposition (ALD), procedure to deposit a second portion of said titanium nitride barrier layer, resulting in said titanium nitride barrier layer located on the top surface of said low k layer and on said sidewalls and bottom of said opening, with said titanium nitride barrier layer comprised of said first portion of said titanium nitride barrier layer and of said second portion of said titanium nitride barrier layer overlying said first portion thereof; and forming a copper structure in said opening in said low k layer, with said copper structure directly contacting said second portion of said titanium nitride barrier layer, and being free of contact with said first portion of said titanium nitride barrier layer.

17. The method of claim 16, wherein said low k layer is a porous low k layer such as a fluorinated silicon glass (FSG) layer, or a silicon low k (SiLK) layer.

18. The method of claim 16, wherein said low k layer is comprised with a dielectric constant between about 2.5 to 3.

19. The method of claim 16, wherein the thickness of said low k layer is between about 3000 to 7000 Angstroms.

20. The method of claim 16, wherein said opening in said low k layer is defined via an anisotropic reactive ion etch procedure using $CHF_3$ as an etchant for said low k layer.

21. The method of claim 16, wherein the smallest dimension, diameter or width of said opening, is between about 0.12 to 0.14 um.

22. The method of claim 16, wherein said atomic layer deposition procedure is performed using $TiCl_4$ and $NH_3$ as reactants.

23. The method of claim 16, wherein the thickness of said second portion of said titanium nitride barrier layer is between about 100 to 300 Angstroms.

24. The method of claim 1, wherein said performing of said first deposition procedure, said performing of said second deposition procedure, and said forming of said conductive structure are carried out so that, in a direction approximately parallel to said top surface, said conductive structure has a dimension that is greater than a thickness of either of said first portion and said second portion of said conductive layer.

25. The method of claim 8, wherein said performing of said first deposition procedure, said performing of said second deposition procedure, and said forming of said upper level metal structure are carried out so that, in a direction approximately parallel to said top surface, said upper level metal structure has a dimension that is greater than a thickness of either of said first portion and said second portion of said barrier layer.

26. The method of claim 16, wherein said performing of said physical vapor deposition, said performing of said atomic layer deposition, and said forming of said copper structure are carried out so that, in a direction approximately parallel to said top surface, said copper structure has a dimension that is greater than a thickness of either of said first portion and said second portion of said barrier layer.

* * * * *